United States Patent [19]

Yamada et al.

[11] Patent Number: 4,485,964
[45] Date of Patent: Dec. 4, 1984

[54] METHOD OF IDENTIFYING A MULTIPLICITY OF SPECIAL POINTS

[75] Inventors: Mitsuhiko Yamada; Isao Tokura, both of Kyoto, Japan

[73] Assignee: Dainippon Screen Seizo Kabushiki Kaisha, Kyoto, Japan

[21] Appl. No.: 484,151

[22] Filed: Apr. 12, 1983

[30] Foreign Application Priority Data

Jun. 10, 1982 [JP] Japan ................................ 57-101532

[51] Int. Cl.³ ............................................. G06K 1/00
[52] U.S. Cl. ........................................ 234/2; 234/65; 234/75; 250/559; 408/3
[58] Field of Search .................... 234/2, 3, 65, 75; 408/3; 33/1 G, 1 L, 1 CC; 250/559

[56] References Cited

U.S. PATENT DOCUMENTS 3,692,237  9/1972  Fiderer .................................. 234/2

FOREIGN PATENT DOCUMENTS 2498508  7/1982  France ................................. 408/3

Primary Examiner—James M. Meister
Attorney, Agent, or Firm—Poms, Smith, Lande and Rose

[57] ABSTRACT

A multiplicity of special points are identified and recorded as a photoelectrical scanning process. Each special point is marked as an annular pattern on a pattern sheet. The ground of the pattern sheet, the annular pattern and the interior of the annular pattern may have various optical densities and color properties and through detection of such optical properties with at least one light receiving head the exact center of the interior of the annular pattern is detected. This method will be highly useful in automatically drilling holes for mounting component parts in a printed circuit board as a process in the manufacture of printed circuit boards.

20 Claims, 19 Drawing Figures

FIG. 8
FIG. 9
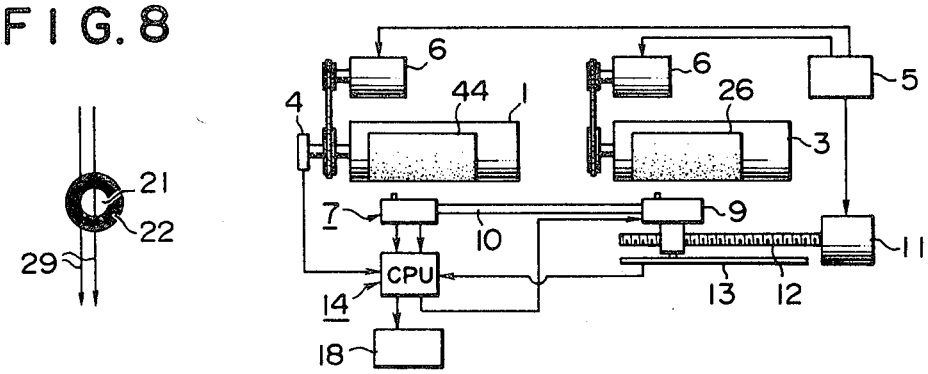
FIG. 10
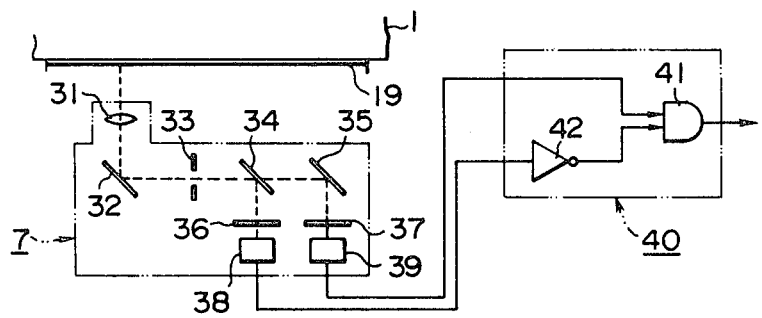
FIG. 11
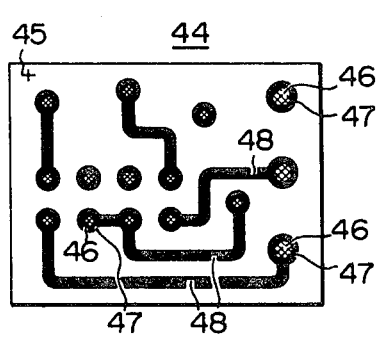
FIG. 12
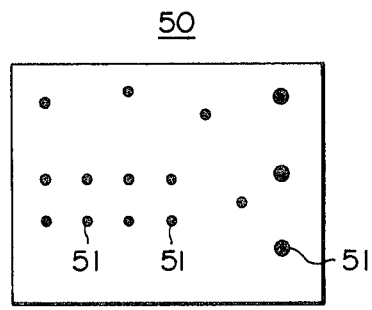

METHOD OF IDENTIFYING A MULTIPLICITY OF SPECIAL POINTS

TECHNICAL FIELD

This invention relates to a method of identifying a multiplicity of special points in a pattern drawn on a sheet and recording the addresses of the thus identified points in recording means and in particular to such a method which makes use of a photoelectric scanning technique and which is useful for the manufacture of printed circuit boards.

BACKGROUND ART

Conventionally, in recording the addresses of positions for drilling holes in a printed circuit board according to a layout pattern as a preliminary step for automatically drilling holes for mounting component parts and for other purposes in a printed circuit board, each position was picked up from a pattern sheet by a human operator on a flat table with the aid of an X-Y digitizer. However, this process was highly laborious and time-consuming, yet was no way free from human errors.

It is conceivable to make use of advanced pattern recognition techniques for such a purpose but none of them have so far been applied successfully to such an application.

Another problem arising in the process of identifying and recording special points in a pattern with manual means is the difficulty of ascertaing the accuracy of the identified and recorded special points; there must a good way of making sure that there is no omission or error in the record.

Conventionally, such checking work was carried out by reading the perforated tape into which the identified addresses are recorded and plotting them on an automatic drafting machine or an X-Y recorder. But due to the nature of such a machine the plotting work was substantially time-consuming and caused a substantial slow-down in the otherwise highly automated process of making a printed circuit board.

DISCLOSURE OF THE INVENTION

In view of such shortcomings of the prior art, a primary object of this invention is to provide a method of identifying a multiplicity of special points in a pattern drawn on a sheet by scanning the pattern with a photoelectric converter and recording the addresses of the thus identified special points in recording means.

Another object of this invention is to provide such a method which may be automated and substantially free from errors.

Yet another object of this invention is to provide a method of identifying the positions for drilling holes in a printed circuit board from a pattern sheet and recording the addresses of the thus identified positions in recording means according to which an automatic drilling machine can actually drill holes in a printed circuit board.

Yet another object of this invention is to provide such a method which additionally provides a means for readily ascertaining the accuracy of the positions thus identified.

According to this invention, such objects are accomplished by providing a method of recording the addresses of a multiplicity of special points in a pattern drawn on a sheet, comprising the steps of preparing a pattern sheet in which special points are each indicated by a substantially annular pattern having an optical density level different from that of the ground of the sheet and surrounding the special point, preparing a mask sheet in which the special points are indicated by dots having an optical density different from that of the ground of the sheet and dimensioned to be smaller than the outer periphery of the corresponding annular pattern but to be greater than the inner periphery of the same annular pattern, mounting the pattern sheet on a first rotary drum and the mask sheet on a second drum which may be photoelectrically scanned by a first light receiving head and a second light receiving head, respectively, identifying the special points by the location of the light receiving heads at which only the second light receiving head detects an optical density level different from that of the ground of the corresponding sheet and recording the thus detected special points in recording means, or a method of recording the addresses of a multiplicity of special points in a pattern drawn on a sheet, comprising the steps of preparing a pattern sheet in which special points are each indicated by a substantially annular pattern having an optical property different from that of the the ground of the sheet and surrounding the special point, mounting the pattern sheet on a rotary scanning drum which may be scanned by a light receiving head, identifying the special points by obtaining, from the light receiving head, a pulse of a certain width when the scan line encounters the outer periphery of each of the annular patterns after scanning the ground of the sheet and a second pulse of a certain width when the scan line encounters the inner periphery of the substantially annular pattern after crossing the interior of the substantially annular pattern and then by detecting the location of the scanning head at which the first and the second pulses mutually overlap, and recording the thus detected special points in recording means.

BRIEF DESCRIPTION OF THE DRAWINGS

Other objects, features and advantages of this invention will become apparent from a cosideration of the following detailed description and from the accompanying drawings, in which:

FIG. 8 is magnified plan view illustrating the mode of scanning the positions for drilling hole indicated on a pattern sheet;

FIG. 9 is a schematic view of a device for carrying out another embodiment of the method of this invention;

FIG. 10 is a schematic diagram illustrating light receiving heads and a discrimination circuit;

FIG. 11 is a plan view of a pattern sheet in which the positions for drilling holes are colored;

FIG. 12 is a plan view of a developed photosensitive material sheet;

BEST MODES OF CARRYING OUT THE INVENTION

Figure 1:
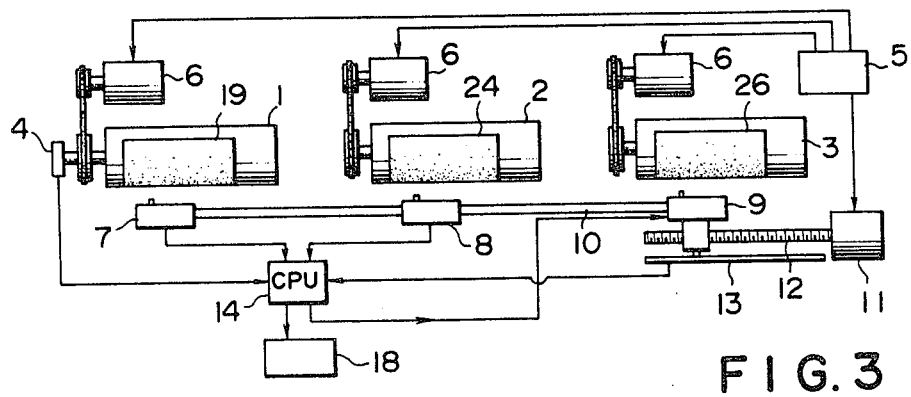
FIG. 1 is a schematic view of a device for carrying out the method of this invention.

In FIG. 1, three drums;, i.e., a pattern sheet drum 1, a mask sheet drum 2 and a recording drum 3; are driven ny motors 6, respectively, at a preselected fixed speed. The three motors 6 are mutually synchronized by a common motor control circuit 5. A rotary encoder 4 is provided on the pattern sheet drum 1.

A first light receiving head 7, a second light receiving head 8 and a recording head 9 are mounted on a common connecting rod 10 which is threadably engaged with a screw rod 12 rotatably driven by a motor 11 so that each of the heads may be moved in the close vicinity of the corresponding drum; i.e., the first light receiving head 7 on the pattern sheet drum 1, the second light receiving head 8 on the mask sheet drum 2 and the recording head 9 on the recording drum 3; along the common axial line of the three drums. The linear motion of the three heads is detected by a linear encoder 13 which is provided along the screw rod 12 and the speed of the motor 11 is controlled by the above-mentioned motor control circuit 5.

Figure 2:
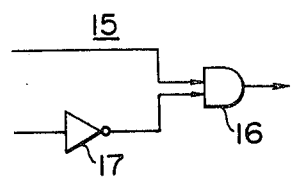
FIG. 2 is a detailed circuit diagram of a discrimination circuit.

The outputs from the first and the second light receiving head 7 and 8, the rotary encoder 4 and the linear encoder 13 are supplied to a CPU (central processing unit) 14 which includes a discrimination circuit 15 shown in FIG. 2. This discrimination circuit 15 includes an AND gate circuit 16 which is connected directly to the output of the first light receiving head 7 at one of its input terminals and is connected to the output of the second light receiving head 8 by way of an inverter 17 at the other of its input terminals. The output of the CPU 14 is connected to a paper tape perforator 18 and the recording head 9.

Figure 3:
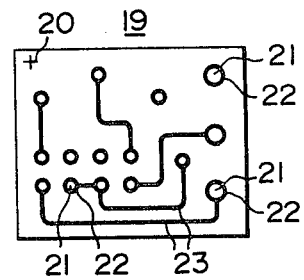
FIG. 3 is a plan view of a pattern sheet.

FIG. 3 shows an example of layout pattern sheet 19 with a white ground color for making a printed circuit board. Numeral 20 denotes a reference point while numeral 22 denotes substantially annular lands of black color each surrounding a position for drilling a hole and defining a central area 21 within its inner pheriphery. The central areas 21 may be of the same color as the gound of the sheet. Numeral 23 denote connecting lines and may be of black color.

Figure 4:
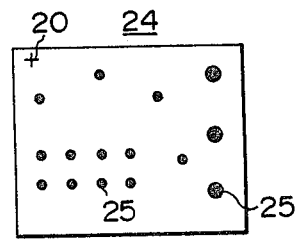
FIG. 4 is a plan view of a mask sheet.

FIG. 4 shows an example of mask sheet 24 with white ground color. Numeral 20 likewise denotes a reference point while numeral 25 denotes substantially circular masks which are drawn over the places corresponding to the positions for drilling holes, dimensioned to be greater than the central area but to be smaller than the outer periphery of the substantially annular land 22.

The masks 25 may not be necessarily exactly concentric but may well be irregular in shape as long as it satisfies the above-named conditions and may have arbitrary color and optical density.

The pattern sheet 19, the mask sheet 24 and the photosensitive material sheet 27 are mounted on the drums 1, 2 and 3, respectively, on their mutually corresponding places.

During the operation of the device shown in FIG. 1, when the white ground of the pattern sheet 19 is being scanned, the two light receiving heads 7 and 8 are both at high level and, since the output of the second light receiving head 8 is inverted by the inverter 17, the output of the discriminating circuit 15 is always low in level.

Figure 6:
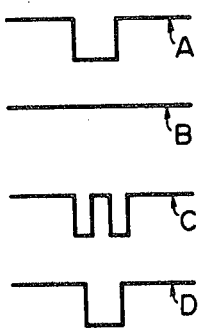
FIG. 6 shows the output wave forms of light receiving heads.

And, when the connecting lines 23 of the pattern sheet 19 are being scanned, the outputs of the two light receiving heads 7 and 8 have wave forms such A and B shown in FIG. 6, respectively, and, since the output of the second light receiving head 8 is inverted from high level to low level, the output of the discriminating circuit 15 is likewise low in level.

However, when the interior 21 of one of the annular lands 22 is being scanned, the outputs of the two light receiving heads 7 and 8 become as shown by wave forms C and D shown in FIG. 6, respectively. Hence the output of the discriminating circuit 15 is raised to high level only when one of the positions for drilling holes included in the interior 21 in the annular land 22 is scanned, as indicated by wave form E in FIG. 6, and a paper tape perforator (which is not shown in the drawings) to record the addresses corresponding to the positions for drilling holes relative to the reference point 20 as indicated by the encoders 4 and 13 after the CPU 14 has determined a central position in the interior 21 of each of the annular lands 22 as will be described hereinafter.

At the same time, the output of the CPU 14 accordingly exposes the photosensitive material sheet 26 mounted on the recording drum 3 photographically according to the output from the CPU 14. When the whole scanning is thus completed, blackened images 28 are formed on the photosensitive material sheet 26, when it is developed, in places corresponding to the positions for drilling identified as the center of the interior 21 of each of the annular lands 22.

Thus, one can readily ascertain visually if every one of the positions for drilling holes, identified as the center of the interior 20 of each of the annular lands 22 are recorded in the perforated tape simply by laying this photosensitive material sheet 26 over the pattern sheet 19.

When the scanning line 29 touches the left end of the interior 20 of one of the annular lands 22 as shown in FIG. 6, the output of the discriminating circuit 15 rises to high level and, if the diameter of the hole is known beforehand, the center of the position for drilling a hole is readily determined as it is located to the right of the left end of the interior 21 of the annular land 22 by the radius of the inner perimeter of the annular land 22. And this determination may be carried out by the CPU 14 or a separate circuit for compensation which is not shown in the drawings.

Alternatively, it is possible to determine the address of the center of the interior 21 of each of the annular lands 22 either by detecting the widest one of all the signals detecting the interior 21 of the land 22 and outputting the address at which the widest signal was obtained or by computing an average value of all the addresses at which the interior 21 of the annular lands 22 was detected.

As an embodiment based on the former concept, the following method is possible.

First, the signal (for instance, signal E shown in FIG. 7) obtained by scanning the interior 21 of an annular land 22 and its address are stored in a register E. Since the width of the signal is maximum in the center of the interior 21 of the land 22, the width of the signal stored in the register R is compared with the signal obtained by the current scanning of the interior 21 of the annular land 22 with a comparator and the content of the register R is replaced only when the width of the signal obtained by the current scanning is greater than the width of the signal stored in the register R.

Next, the width of the signal stored in the register R is compared with the width of the signal obtained by the next scanning and the renewal of the content of the register R is repeated according to the same criterion. Generally, when the scanning line has not reached the center of the land, the new scan lines always give rise to signal widths which are greater than the previous ones and the content of the register R is renewed every time. When the scan line passes through the center of the land, this tendency is reversed and the content of the register R stops to be renewed and the address at which the signal stored in the register R was obtained is determined as the address of the center of the land with respect to the X coordinate.

As an embodiment based on the latter concept, the following method is possible.

Figure 7:
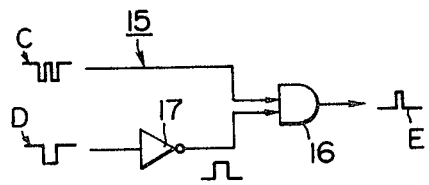
FIG. 7 is a circuit diagram illustrating the action of a discrimination circuit.
Figure 5:
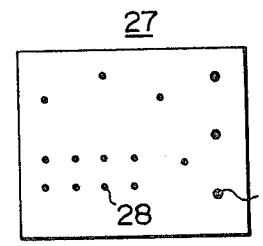
FIG. 5 is a plan view of a developed photosensitive material sheet.
Figure 13:
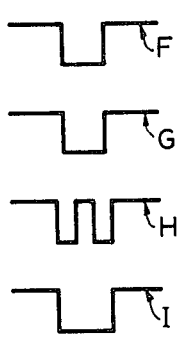
FIG. 13 is the output wave forms of a light receiving head.
Figure 14:
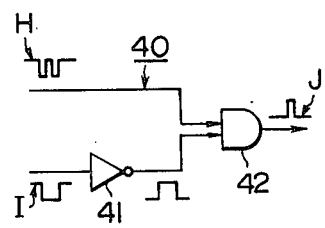
FIG. 14 is a circuit diagram illustrating the action of a discrimination dircuit.

First, since a signal as shown in E of FIG. 7 is produced when the interior of a land is detected, the signal E is obtained throughout the time the scan line scans from the left end to the right end of the interior 21 of the land 22 shown in FIG. 8. Hence, the address of the center of the interior 21 of the land 22 is determined by computing the sum of the X-coordinate addresses of the interior of the land from its left end to its right end and dividing the sum by the number of scan lines which traversed the interior of the land.

The output of the discriminating circuit 15 rises to high level as soon as the scan line 29 reaches the upper end of the interior 21 of the land 22 before crossing the center of interior of the land but the actual center is located below this point by the radius of the interior of the land. Hence, the center of the interior of the land may be obtained simply by compensating the address by half the longitudinal or lateral width of the output wave form E with the CPU 14 or a separate compensation circuit.

The same principle may be applied with respect to the Y-coordinate for the complete determination of the positions for drilling holes.

The pattern sheet 19 and the mask sheet 24 are mounted on the two separate drums 1 and 2 which are mutually synchronized but it is also possible to mount both the pattern sheet 10 and the mask sheet 24 on a single drum, using a single light receiving head 7 or 8.

As can be seen from the above description, a mask sheet 24 has to be prepared in carrying out the method of this invention, but, since no great accuracy is required in the preparation of the mask sheet 24, it can be readily prepared without much labor. Since all the addresses are automatically recorded even when the number of positions for drilling holes is very great, the advantage in the saving of labor and cost is extremely great, yet substantially free from human errors.

FIGS. 9 to 15 relate to another embodiment in which the positions of interest are marked with a certain color.

In FIG. 9, numerals 1 and 3 denote a scanning drum and a recording drum, respectively. The scanning drum 1 is provided with a rotary encoder 4 and the two drums 1 and 3 are driven by corresponding motors 6 which are mutually synchronized by a motor control circuit 5.

Numeral 7 and 9 denote a light receiving head and a recording head which are provided close to the scanning drum 1 and the recording drum 3, respectively, and are mutually connected by a connecting rod 10 which is in turn threadably engaged with a screw rod 12 driven by a motor 11 so that the two heads moves along the common axial line of the two drums 1 and 3 in synchronization. The position of the two heads 1 and 3 is detected by a linear encoder 13 and the motor 11 is controlled to a preselected speed by a motor control circuit 5.

In FIG. 10, the light received through a lens 31 of the light receiving head 7 is reflected to the right in the sense of the drawing by a first mirror 32 and, after being reflected again by a half mirror 34 and a second mirror 35 by way of a slit 33, is detected by a first photoelectric converter 38 and a second photoelectric converter 39 which are provided with a green filter 36 and a red filter 37, respectively.

Numeral 40 denotes a CPU having a discrimination circuit 40 therein. The output of the second photoelectric converter 39 is directly supplied to one of the inputs of an AND gate circuit 41 which makes up the discrimination circuit 40 and the output of the first photoelectric converter 38 is supplied, by way of an inverter 42, to the other of the inputs of the gate circuit 41. The output of the CPU 14 is supplied to both a paper tape perforator 18 and the recording head 9.

FIG. 11 shows a layout pattern sheet 44 for making a printed circuit board with a white ground color. In this pattern sheet 44, numeral 45 denotes a reference point, numeral 47 a substantially annular black land surrounding the position for drilling a hole, numeral 46 the interior of the substantially annular land 47 containing the position for drilling a hole and painted in red color, and numeral 48 a black connecting line.

This layout pattern sheet 44 and a photosensitive material sheet 26 are mounted on the scanning drum 1 and the recording drum 3, respectively, in corresponding manner.

When the above-described device is activated, the outputs of the two photoelectric converters 38 and 39 both remain at high level during the time the white ground of the layout pattern sheet 44 is being scanned. Since the output of the first photoelectric converter 38 is inverted by the inverter 41, the output of the discriminating circuit 40 remains at low level.

Figure 15:
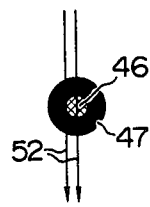
FIG. 15 is a magnified plan view illustrating the mode of scanning a position for drilling holes from a pattern sheet.

When the connecting line 48 of the layout pattern sheet 44 is being scanned, the outputs of the two photoelectric converters 38 and 39 respond in the same phase as shown by wave forms F and G in FIG. 15. Since the output of the first photoelectric converter 38 is inverted by the inverter 41, the output of the discriminating circuit 40 likewise remains at low level.

However, when the interior 46 of the annular land 47 in the layout pattern sheet 44 is being scanned, the second photoelectric converter 38 receives light but the first photoelectric converter 39 does not receive light since the interior 46 of the annular land 47 is painted with red color. Hence, the outputs from the two photoelectric converters 38 and 39 are then as shown by wave forms H and I, respectively, and supplied to the inputs of the discrimination circuit 40 which produces a high level signal as shown by wave form J in FIG. 14 only when the interior 46 of one of the annular lands is being scanned. Thus, the paper tape perforator 18 records the addresses of the positions for drilling holes according to the information supplied from the two encoders 4 and 13 on the position of the interior 46 of each of the annular lands 47 relative to the reference point 45 in paper tape.

At the same time, the photosensitive material sheet 26 mounted the recording drum 3 is photographically exposed by the recording head 9 according to the output from the CPU 14 and when the scanned photosensitive material sheet is photographically developed blackened images 51 corresponding to the interiors 46 of the substantially annular lands 47 indicated on the pattern sheet 44 are obtained on the photographic film 50. Therefore, by laying this photosensitive sheet 26 over the pattern sheet 44, it is possible to readily ascertain the accuracy of the identification of all the positions for drilling holes in a printed circuit board.

When the scan line 52 touches the left end of the interior 46 of an substantially annular land 47, the output of the discrimination circuit 40 rises to high level immediately but the actual center of the interior 46 of the substantially annular land 47 is located to the right by the distance equal to the radius of the interior 46 of the annular land 47. Therefore, a delay circuit not shown in the drawing may be provided in association with the CPU 14 for carrying out the necessary compensation.

Also, when the scan line 52 passes through the center 46 the interior 47 of an annular land 47 from above, the output of the discriminating circuit 40 rises to high level as soon as the scan line 52 reaches the upper end of the interior 46 of the annular land 46, but the actual center of the interior 46 of the annular land 47 is located below that point by the raidus of the interior 46 of the annular land 47. To compensate this discrepancy, the output signal from the discrimiating circuit 40 may be processed by a delay circuit not shown in the drawing which adjusts the output signal by half the width of the wave form J with certain software provided in association with the CPU 14 or with a separate delay circuit.

The accuracy of the addresses may be raised to a desired level by making the pitch of the secondary scanning smaller and/or by processing the output signals from the encoders with a phase locked loop circuit.

FIGS. 16 to 19 shows a different embodiment of the method according to this invention in which the substantially annular lands are defined by a certain color.

Figure 16:
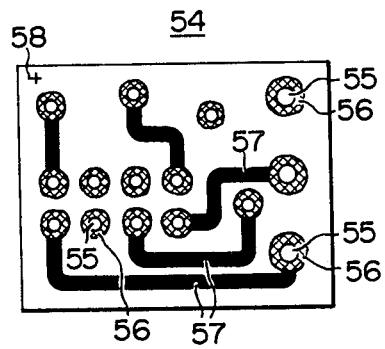
FIG. 16 shows a pattern sheet in which the annular lands are colored.

In FIG. 16, the color of the interior 55 of a substantially annular land 56 is in the same color as the ground of the pattern sheet 54 but the substantially annular lands 56 are marked with red color while connecting lines 57 are marked with black color. Numeral 58 denotes a reference point.

The external profile of the substantially annular lands 56 which are marked with the red color may not be concentric to the interior 55 thereof but may be substantially irregular in shape and the annular lands 56 themselves may have a color different from red.

Figure 18:
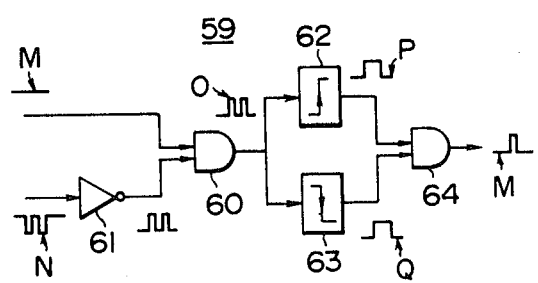
FIG. 18 is a circuit diagram illustrating the action of the discrimination circuit.

FIG. 18 shows a discrimination circuit 59 which corresponds to the previously mentioned discrimination circuit 40 in function and comprises a first gate circuit 60, an inverter 61, a flip-flop circuit 62 which responds to the rising slope of a pulse, another flip-flop circuit 63 which responds to the falling slope of a pulse and a second gate circuit 64.

Figure 17:
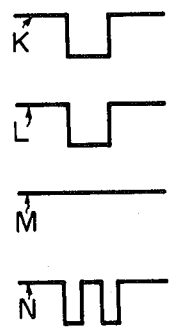
FIG. 17 shows the output wave forms of a light receiving head.

According to this embodiment, as a pattern sheet 54 mounted on the scanning drum 1 of FIG. 9 is photoelectrically scanned, the outputs of the two photoelectric converters 38 and 39 are both in high level when the ground of the pattern sheet 54 is being scanned and are made up of signals of identical phase as shown by wave forms K and L, respectively, in FIG. 17 when a black connecting line is being scanned. Therefore, in either case, the output of the first gate circuit 60 is always at low level while the output of the second gate circuit 64 is likewise always at low level.

However, when one of the substantially annular red lands 56 on the pattern sheet 54 is being scanned, it is detected by the second photoelectric converter 39 but not by the first photoelectric converter 38 with the result that the outputs of the first and the second photoelectric converters 38 and 39 are obtained as wave forms M and N shown in FIG. 17 and are supplied to the inputs of the discrimination circuit 59.

Figure 19:
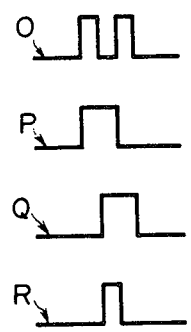
FIG. 19 is the wave forms of a signal passing through the discrimination circuit.

Then, the first gate circuit 60 produces a signal with the wave form as shown by 0 in FIG. 19 and the two flip-flop circuits 62 and 63 connected to the first gate cirucuit 60 at their inputs produces signals having mutually offset pulses as shown by wave forms P and Q, respectively, in FIG. 19.

Then, the first gate circuit 60 produces a signal with the wave form as shown by 0 in FIG. 19 and the two flip-flop circuits 62 and 63 connected to the first gate cirucuit 60 at their inputs produces signals having mutually offset pulses as shown by wave forms P and Q, respectively, in FIG. 19.

The two wave forms are identical in shape but have phases which are mutually offset slightly. Therefore, the second gate circuit 64 connected to the outputs of the two flip-flop circuits 62 and 63 produces a signal corresponding to the interior 55 of an annular land 56 as an overlapping in the outputs of the two flip-flop circuits 62 and 63. Thus, the paper tape perforator 18 connected to the output of the second gate circuit 64 perforates paper tape according to the addresses of the positions for drilling holes in a printed circuit board indicated by the encoders 4 and 13 relative to the reference point 58.

At the same time, a photosensitive material sheet 26 may be photoelectrically exposed on the recording drum 3 by the recording head 9 to produce a photographic film 50 marked with black dots 51 in point-by-point association with the positions for drilling holes for ascertaining the accuracy of the identification of the special points.

In this case also, some measure should be taken to exactly identify the center of the interior 55 of each of the annular lands 56.

As described above, according to the method of this invention, the addresses of a large number of positions for drilling holes can be readily and automatically recorded in recording means without any manual operation, thus drastically saving cost and labor and reducing possible human errors as compared with conventional methods.

Also, since the identified positions may be recorded at the same time as identifying these points, the method of this invention additional offers the means of allowing simple checking of the accuracy of the identification.

The marking of annular lands and/or interior the annular lands may be made either by applying appropriate dye or pigment to the relevant areas on the pattern sheet or by affixing adhesive tape or thin slip to the relevant positions of the pattern sheet.

When it is necessary to differentiate some of substantially annular lands, they may be provided in various sizes and marked with different color and/or optical densities.

Additionally, by using a multi-bean light receiving heads instead of the light receiving head of the single beam type, it is possible to handle more than one pattern sheet at the same time and to thereby reduce the time required for processing each of the pattern sheets.

Although the present invention was described in terms of specific embodiments, it is obvious to a person skilled in the art that various changes may be made in form and detail without departing fromthe spirit and scope of this invention.

What is claimed is:

1. A method of recording the addresses of a multiplicity of special points in a pattern drawn on a sheet, comprising the steps of:
preparing a pattern sheet in which special points are each indicated by a substantially annular pattern having an optical density level different from that of the ground of the sheet and surrounding the special point;
preparing a mask sheet in which the special points are indicated by dots having an optical density level different from that of the ground of the sheet and dimensioned to be smaller than the outer perimeter of the corresponding annular pattern but to be greater than the inner perimeter of the same annular pattern;
mounting the pattern sheet on a first rotary drum and the mask sheet on a second rotary drum which may be photoelectrically scanned by a first light receiving head and a second light receiving head, respectively;
identifying the special points by the location of the light receiving heads at which only one of the light receiving heads detects an optical density level different from that of the ground of the corresponding sheet; and
recording the thus detected special points in recording means.

2. A method according to claim 1, wherein each of the special points is identified as the point which is displaced from the point at which an end of the interior of the substantially annular land is first detected in the secondary scanning direction by the radius of the interior of the substantially annular land with regards to two nonparallel directions on the pattern sheet.

3. A method according to claim 1, wherein each of the special points is identified as the point at which the detected width of the interior of the substantially annular land ceases increasing at each scanning with regards to two non-parallel direction on the pattern sheet.

4. A method according to claim 1, wherein each of the special points is identified by averaging all the coordinates detected as being contained in the interior of the substantially annular land.

5. A method according to claim 1, wherein a recording drum and a recording head associated therewith are additionally provided for recording the interior of each of the annular land detected in the process of identifying the special points as a corresponding dot on a mask sheet and the mask sheet thus prepared is laid over the pattern sheet to ascertain the accuracy of the identification of the special points.

6. A method according to claim 1, wherein the recording means is paper tape according to which a drilling machine can drill holes in the prescribed places of a printed circuit board.

7. A method of recording the addresses a multiplicity of special points in a pattern drawn on a sheet, comprising the steps of:
preparing a pattern sheet in which special points are each indicated by a substantially annular pattern having an optical property different from that of the ground of the sheet and surrounding the special point;
mounting the pattern sheet on a rotary scanning drum which may be scanned by a light receiving head;
identifying the special points by obtaining, from the light receiving head, a pulse of a certain width when the scan line encounters the outer periphery of each of the substantially annular lands after scanning the ground of the sheet and a second pulse of a certain width when the scan line encounters the inner periphery of the substantially annular land after crossing the interior of the substantially annular land and then by detecting the location of the scanning head at which the first and the second pulse mutually overlap; and
recording the thus detected special points in recording means.

8. A method according to claim 7, wherein each of the special points is identified as the point which is displaced from the point at which an end of the interior of the substantially annular land is first detected in the secondary scanning direction by the radius of the interior of the substantially annular land with regards to two nonparallel directions on the pattern sheet.

9. A method according to claim 7, wherein each of the special points is identified as the point at which the detected width of the interior of the substantially annular land ceases increasing at each scanning with regards to two non-parallel direction on the pattern sheet.

10. A method according to claim 7, wherein each of the special points is identified by averaging all the coordinates detected as being contained in the interior of the substantially annular land.

11. A method according to claim 7, wherein a recording drum and a recording head associated therewith are additionally provided for recording the interior of each of the annular land detected in the process of identifying the special points as a corresponding dot on a mask sheet and the mask sheet thus prepared is laid over the pattern sheet to ascertain the accuracy of the identification of the special points.

12. A method according to claim 7, wherein the recording means is paper tape according to which a drilling machine can drill holes in the prescribed places of a printed circuit board.

13. A method of recording the addresses of a multiplicity of special points in a pattern drawn on a sheet, comprising the steps of:
preparing a pattern sheet in which the special points are each indicated by a substantially annular pattern with a first optical property different from that of the ground of the sheet and surrounding the special point and by a substantially circular pattern with the second optical property different from the ground of the patterns sheet dimensioned to be greater than the interior of the inner periphery of the substantially annular pattern but to be smaller than the outer periphery of the substantially annular pattern;

mounting the pattern sheet on a rotary drum which may be photoelectrically scanned by a light receiving head having a first photoelectric sensor which is sensitive to only to the first optical property and a second photoelectric sensor which is sensitive only to the second optical property;

identifying the special points at which the second optical sensor detects the second optical property but the first optical sensor does not detect the first optical property; and recording the thus identified special points in a recording means.

14. A method according to claim 13, wherein the two optical sensors are provided with different optical filters and are so aligned that an incident light beam obtained from the pattern sheet is diverted to both of the optical sensors by way of at least one half-mirror.

15. A method according to claim 14, wherein each of the special points is identified as the point which is displaced from the point at which an end of the interior of the substantially annular land is first detected in the secondary scanning direction by the radius of the interior of the substantially annular land with regards to two non-parallel directions on the pattern sheet.

16. A method according to claim 14, wherein each of the special points is identified as the point at which the detected width of the interior of the substantially annular land ceases increasing at each scanning with regards to two non-parallel direction on the pattern sheet.

17. A method according to claim 14, wherein each of the special points is identified by averaging all the coordinates detected as being contained in the interior of the substantially annular land.

18. A method according to claim 14, wherein a recording drum and a recording head associated therewith are additionally provided for recording the interior of each of the annular land detected in the process of identifying the special points as a corresponding dot on a mask sheet and the mask sheet thus prepared is laid over the pattern sheet to ascertain the accuracy of the identification of the special points.

19. A method according to claim 14, wherein the recording means is paper tape according to which a drilling machine can drill holes in the prescribed places of a printed circuit board.

20. A method of recording the addresses of a multiplicity of special points in a pattern drawn on a sheet, comprising the steps of:

preparing a pattern sheet in which special points are each indicated by a substantially annular pattern having an optical density level different from that of the ground of the sheet and surrounding the special point;

preparing a masking sheet in which the special points are indicated by dots having an optical density level different from that of the ground of the sheet and dimensioned to be smaller than the outer periphery of the corresponding annular pattern but to be greater than the inner periphery of the same annular pattern;

mounting the pattern sheet and the mask sheet on a rotary scanning drum which may be photoelectrically scanned by at least one light receiving head, respectively;

sequentially scanning the pattern sheet and the mask sheet with the light receiving head and storing the signals thus obtained;

identifying the special points by the locations of the light receiving heads, on the pattern sheet and the mask sheet, at which the light receiving head detects an optical density level different from that of the ground only at one of the two corresponding places of the pattern sheet and the mask sheet; and recording the thus detected special points in recording means.

* * * * *